(12) United States Patent
Roesner et al.

(10) Patent No.: US 11,282,805 B2
(45) Date of Patent: Mar. 22, 2022

(54) SILICON CARBIDE DEVICES AND METHODS FOR MANUFACTURING THE SAME

(71) Applicant: Infineon Technologies AG, Neubiberg (DE)

(72) Inventors: Michael Roesner, Villach (AT); Markus Menath, Regensburg (DE); Gudrun Stranzl, Goedersdorf (AT)

(73) Assignee: Infineon Technologies AG, Neubiberg (DE)

( * ) Notice: Subject to any disclaimer, the term of this patent is extended or adjusted under 35 U.S.C. 154(b) by 1 day.

(21) Appl. No.: 16/360,570

(22) Filed: Mar. 21, 2019

(65) Prior Publication Data

US 2019/0295981 A1 Sep. 26, 2019

(30) Foreign Application Priority Data

Mar. 22, 2018 (DE) .......................... 102018204376.0

(51) Int. Cl.
*H01L 29/45* (2006.01)
*H01L 23/00* (2006.01)
*H01L 21/04* (2006.01)
*H01L 29/16* (2006.01)

(52) U.S. Cl.
CPC .......... *H01L 24/29* (2013.01); *H01L 21/0485* (2013.01); *H01L 24/27* (2013.01); *H01L 29/1608* (2013.01); *H01L 29/45* (2013.01); *H01L 2224/29082* (2013.01); *H01L 2224/29111* (2013.01); *H01L 2224/29139* (2013.01); *H01L 2224/29155* (2013.01); *H01L 2224/29166* (2013.01); *H01L 2224/29172* (2013.01); *H01L 2224/29184* (2013.01); *H01L 2924/014* (2013.01); *H01L 2924/046* (2013.01); *H01L 2924/0455* (2013.01); *H01L 2924/04541* (2013.01); *H01L 2924/04563* (2013.01); *H01L 2924/10272* (2013.01); *H01L 2924/12032* (2013.01); *H01L 2924/13091* (2013.01); *H01L 2924/3512* (2013.01)

(58) Field of Classification Search
CPC ..... H01L 29/45; H01L 21/0485; H01L 24/27; H01L 29/1608; H01L 2924/014; H01L 2224/29082; H01L 2224/29166; H01L 2224/29155; H01L 2224/29184; H01L 24/29
USPC .......................................................... 257/77
See application file for complete search history.

(56) References Cited

U.S. PATENT DOCUMENTS

| | | | |
|---|---|---|---|
| 7,359,487 B1 * | 4/2008 | Newcome | H01J 35/08 378/119 |
| 7,806,994 B2 | 10/2010 | Smith et al. | |
| 9,269,579 B2 | 2/2016 | Kinoshita et al. | |

(Continued)

FOREIGN PATENT DOCUMENTS

| | | | |
|---|---|---|---|
| DE | 4105596 A1 | 8/1992 | |
| DE | 19514081 A1 | 10/1996 | |

(Continued)

*Primary Examiner* — Karen Kusumakar
*Assistant Examiner* — Adam S Bowen
(74) *Attorney, Agent, or Firm* — Murphy, Bilak & Homiller, PLLC

(57) ABSTRACT

A semiconductor device includes a silicon carbide layer, a metal carbide layer arranged over the silicon carbide layer, and a solder layer arranged over and in contact with the metal carbide layer.

20 Claims, 9 Drawing Sheets

(56) References Cited

U.S. PATENT DOCUMENTS

| | | | | |
|---|---|---|---|---|
| 10,084,046 B1 * | 9/2018 | Asaba | .................. | H01L 29/0623 |
| 2010/0148367 A1 * | 6/2010 | Matsuo | ................... | C22C 1/002 |
| | | | | 257/751 |
| 2013/0330571 A1 * | 12/2013 | Varma | ..................... | H01L 24/03 |
| | | | | 428/627 |
| 2014/0051241 A1 * | 2/2014 | Kinoshita | ........... | H01L 29/6606 |
| | | | | 438/602 |
| 2015/0048383 A1 * | 2/2015 | Tsuji | ....................... | H01L 29/45 |
| | | | | 257/77 |
| 2016/0056041 A1 * | 2/2016 | Tamaso | ............... | H01L 29/1608 |
| | | | | 438/602 |
| 2018/0040563 A1 * | 2/2018 | Yoshida | ............ | H01L 21/76885 |
| 2018/0231698 A1 * | 8/2018 | Sutherland | ............... | G02B 5/08 |
| 2020/0044031 A1 * | 2/2020 | Pham | .................. | H01L 21/0485 |

FOREIGN PATENT DOCUMENTS

| | | |
|---|---|---|
| DE | 10227854 A1 | 5/2003 |
| DE | 102006050360 A1 | 5/2008 |

* cited by examiner

SILICON CARBIDE DEVICES AND METHODS FOR MANUFACTURING THE SAME

TECHNICAL FIELD

The present disclosure relates to semiconductor technology. In particular, the present disclosure relates to silicon carbide devices and methods for manufacturing the same.

BACKGROUND

Silicon carbide devices belong to the so-called wide band gap semiconductor group. These devices offer a number of attractive characteristics for high voltage power semiconductors when compared to commonly used silicon. Electrical contacts of silicon carbide devices, such as e.g. Schottky diodes or MOSFETs, may need to be electrically connected to further components, such as e.g. leadframes or clips. Manufacturers of silicon carbide devices are constantly striving to improve their products and the methods for manufacturing the same. It may thus be desirable to develop silicon carbide devices and associated manufacturing methods that provide improved and cost-efficient electrical connections between the silicon carbide devices and the further components.

SUMMARY

An aspect of the present disclosure relates to a semiconductor device. The semiconductor device comprises a silicon carbide layer. The semiconductor device further comprises a metal carbide layer arranged over the silicon carbide layer. The semiconductor device further comprises a solder layer arranged over and in contact with the metal carbide layer.

The silicon carbide layer may be a part of a silicon carbide wafer, a silicon carbide chip or a silicon carbide die. The following comments with regard to wafers may also hold true for chips or dies, and vice versa. The silicon carbide layer may include active device regions of the semiconductor device. For example, an active device region may include a channel region of a field effect transistor, a base region of a bipolar transistor, a p/n junction of a diode, etc.

The semiconductor device may be soldered to a metal component via the solder layer, wherein the metal carbide layer may be at least partly formed during the solder process. In one example, a backside contact of a silicon carbide chip may be soldered to a die pad. In a further example, a frontside contact of a silicon carbide chip may be soldered to a clip. For multiple chips the solder process may be performed as a parallel batch process on the whole wafer area or as sequential chip soldering on each chip frontside or backside.

The solder layer may include an active solder material. In particular, the solder layer may include a tin-silver solder alloy. The solder layer may additionally include a carbide-forming metal and a rare earth metal as will be explained more detailed later on. A thickness of the solder layer may e.g. lie in a range from 1 micrometer to 30 micrometers, more particular from 5 micrometer to 30 micrometers, more particular from 1 micrometer to 20 micrometers, more particular from 5 micrometer to 20 micrometers.

An arrangement in accordance with the present disclosure may provide a direct soldering of a frontside and/or backside of a chip to a metal component without the need of additional costly metallization stacks arranged on the frontside and/or backside of the chip. In this regard, the frontside of the silicon carbide chip may be specified as the side of the chip at which active device regions may be formed. The metal carbide layer may be electrically conductive. The metal carbide layer may particularly be free from voids and may provide a mechanically stable connection between the chip and the metal component. The solder connection may show reduced mechanical stresses compared to conventional solder connections using metallization stacks. The risk of horizontal chip cracks may thus be significantly lowered.

According to an embodiment the semiconductor device further comprises a carbon-comprising layer arranged between the silicon carbide layer and the metal carbide layer, wherein the carbon-comprising layer is in contact with a top surface of the silicon carbide layer and in contact with a bottom surface of the metal carbide layer. The metal carbide layer may be formed from the carbide-forming metal of the solder layer and carbon of the carbon-comprising layer. If the carbon-comprising is only partly used for the formation of the metal carbide layer, the remaining part of the carbon-comprising layer may be in contact with the formed metal carbide layer.

According to an embodiment, the metal carbide layer is in contact with the silicon carbide layer. If the entire carbon-comprising layer is used for the formation of the metal carbide layer, the formed metal carbide layer may become in contact with the silicon carbide layer.

According to an embodiment the carbon-comprising layer has a graphite crystal structure or a graphite-like crystal structure. That is, the carbon of the carbon-comprising layer may have a layered, planar structure. In each layer the carbon atoms may be arranged in a honeycomb lattice forming hexagonal carbon rings. The carbon atoms in the planes may be bonded covalently, wherein only three of four potential bonding sites may be satisfied. The fourth electron may be free to migrate in the plane such that the carbon-comprising layer may be electrically conductive.

According to an embodiment the metal carbide layer comprises at least one of titanium carbide, nickel carbide, tungsten carbide, vanadium carbide. For example, the carbide-forming metal of the solder layer may include at least one of titanium, nickel, tungsten, vanadium. The metal carbide formed from the carbide-forming metal of the solder layer and carbon of the carbon-comprising layer may thus include at least one of titanium carbide, nickel carbide, tungsten carbide, vanadium carbide. In further examples, the carbide-forming metal may also include at least one of tantalum, boron, aluminum, scandium such that the formed metal carbide layer may also include carbides of these metals.

According to an embodiment the solder layer comprises a carbide-forming metal corresponding to the metal of the metal carbide layer. The carbide-forming metal used for the formation of the metal carbide layer may be provided by the carbide-forming metal atoms of the solder layer.

According to an embodiment a thickness of the metal carbide layer lies in a range from 50 nanometer to 1 micrometer. More particular, the thickness may lie in a range from 50 nanometer to 800 nanometers, more particular from 50 nanometer to 600 nanometers, more particular from 50 nanometer to 400 nanometers, more particular from 50 nanometer to 200 nanometers.

According to an embodiment the semiconductor device further comprises an ohmic contact formed between the silicon carbide layer and the carbon-comprising layer or between the silicon carbide layer and the metal carbide layer. The carbon-comprising layer may be formed by evaporating silicon atoms from the silicon carbide layer as will be explained more detailed later on. Here, vacancies in the silicon carbide layer adjacent to the formed carbon-comprising layer may increase electrical carrier concentrations and an ohmic contact may be formed. The thickness of the carbon-comprising layer may be adjusted to form an ohmic contact with a resistance low enough for silicon carbide diode applications. Depending on the process used for forming the carbon-comprising layer, the carbon-comprising layer may provide different electrical resistances having a linear ohmic electrical performance. The electrical resistance of the carbon-comprising layer may lie in a range from about 70 Ohm (when using a laser process for forming the carbon-comprising layer) to about 200-300 Ohm (when using a micro electrical discharge machining process for forming the carbon-comprising layer). The formed ohmic contact may be arranged between the silicon carbide layer and the metal carbide layer when the entire carbon-comprising layer is used for the formation of the metal carbide layer, i.e. when the metal carbide layer is in contact with the silicon carbide layer.

According to an embodiment the semiconductor device further comprises a solder contact formed between the solder layer and a metal component, wherein the metal component comprises at least one of a leadframe, a die pad, a lead (or pin), a clip, a metal foil. The metal component may be manufactured from a metal or an associated metal alloy, for example copper, nickel, aluminum, stainless steel, etc. For example, the metal component may be configured to provide an electrical connection between internal circuitry or active device regions of the semiconductor device and external components.

According to an embodiment the semiconductor device comprises a silicon carbide diode or a silicon carbide transistor. In particular, the silicon carbide diode may be a silicon carbide Schottky diode and the silicon carbide transistor may be a silicon carbide MOSFET. The active device regions of the diode or the transistor may be formed in the silicon carbide layer of the semiconductor device.

A further aspect of the present disclosure relates to a method. The method comprises forming a carbon-comprising layer on a silicon carbide layer. The method further comprises forming a solder layer on the carbon-comprising layer, wherein the solder layer comprises a carbide-forming metal. The method further comprises forming a metal carbide layer between the carbon-comprising layer and the solder layer, wherein the metal carbide layer is formed from the carbide-forming metal of the solder layer and carbon of the carbon-comprising layer.

According to an embodiment the method further comprises forming a solder contact between the solder layer and a metal component. For example, a silicon carbide wafer or silicon carbide chip including the silicon carbide layer may be soldered to a metal component via the solder layer. The metal component may e.g. be a leadframe, a die pad, a lead, a clip, a metal foil.

According to an embodiment the metal carbide layer is at least partly formed by forming the solder contact. During the solder process the metal carbide layer may be at least partly formed from the carbide-forming metal of the solder layer and carbon of the carbon-comprising layer. Carbide-forming metal atoms of the solder layer may diffuse to the reaction interface and react with carbon of the carbon-comprising layer to form the metal carbide layer.

According to an embodiment the metal carbide layer is at least partly formed by forming the solder layer on the carbon-comprising layer. A part of the metal carbide layer may be formed before forming the solder contact when the solder layer may be applied to the carbon-comprising layer. Carbide-forming metal atoms in the solder layer may diffuse to the interface between the solder layer and the carbon-comprising layer and react with carbon atoms of the carbon-comprising layer to form metal carbide molecules.

According to an embodiment forming the carbon-comprising layer comprises applying a laser process or a micro electrical discharge machining process to the silicon carbide layer. In particular, such heat treatment process may be applied directly to a surface of the silicon carbide layer. The heat treatment process may be applied to the frontside and/or the backside of a silicon carbide wafer or chip. By applying the process to the silicon carbide layer, temperatures of the silicon carbide material may be locally increased for short time periods. Due to the increased temperatures a thermal (or pyrolytic) decomposition of the silicon carbide may occur. Chemical bonds between silicon atoms and carbon atoms of silicon carbide molecules may be broken such that the silicon atoms may be removed from the silicon carbide crystal lattice. The removed silicon atoms may be evaporated. As a result, a thin electrically conductive carbon layer may be left on the silicon carbide surface. In general, the local temperatures at the silicon carbide layer may need to be increased such that pyrolysis of the silicon carbide may occur. In particular, the generated temperatures may be greater than 800° C., more particular greater than 900° C., more particular greater than 1000° C., more particular greater than 1100° C. The laser process may particularly include a laser annealing process in which the silicon carbide material may be annealed using laser light of a laser. Here, the surface of the silicon carbide material may be rapidly heated by the laser light and allowed to self-cool afterwards. Micro electrical discharge machining may also be referred to as "micro spark machining" or "micro spark eroding". Here, the surface of the silicon carbide material may be processed by rapidly recurring current electrical discharges (sparks) between the silicon carbide surface and an electrode which may be subject to an electric voltage and separated by a dielectric liquid during the process.

According to an embodiment forming the carbon-comprising layer comprises evaporating silicon atoms from the silicon carbide layer. The silicon atoms may be evaporated after chemical bonds between silicon atoms and carbon atoms of silicon carbide molecules have been broken by a laser process or a micro electrical discharge machining process. The evaporated silicon atoms may originate from the surface of the silicon carbide material and/or silicon carbide material arranged beneath the surface. Since the vapor pressure of silicon in silicon carbide is higher than the vapor pressure of carbon in silicon carbide, an excess of carbon atoms may remain behind when the silicon atoms evaporate at the surface of the silicon carbide material. Evaporating the silicon atoms may particularly be performed in a vacuum or in an inert gas atmosphere, i.e. in the atmosphere of a gas that practically does not chemically react with silicon carbide at the used temperatures. For example, argon may be used as an inert gas.

According to an embodiment the solder layer comprises a rare earth metal before forming the metal carbide layer. In particular, the rare earth metal may include cerium. The radius of the rare earth metal atoms may particularly be smaller than the radius of the metal-carbide forming atoms in the solder layer. When forming the metal carbide layer at the reaction surface between the solder material and the carbon-comprising layer, the rare earth metal atoms may therefore diffuse to the reaction surface faster than the atoms of the carbide-forming metal. At the reaction surface the rare earth metal atoms may react with oxygen (if present) before the carbide-forming metal atoms may reach the reaction surface. Accordingly, the carbide-forming metal atoms reaching the reaction surface may react with carbon of the carbon-comprising layer (instead of oxygen) such that the metal carbide layer may be properly formed. If the amount of rare earth metal atoms in the solder layer is too small, not all of the oxygen may be bound by the rare earth metal. In this case, the formed metal carbide layer may be partially oxidized.

According to an embodiment the solder layer comprises residual portions of the carbide-forming metal after forming the metal carbide layer. The carbide-forming metal of the solder layer may be not entirely used for forming the metal carbide layer such that residual portions of the carbide-forming metal may remain in the solder layer. For example, the entire carbon-comprising layer may have been used for the formation of the metal carbide layer such that excess carbide-forming metal in the solder layer cannot further react due to the lack of carbon.

According to an embodiment a thickness of the carbon-comprising layer lies in a range from 1 nanometer to 10 micrometers before forming the metal carbide layer. More particular, the thickness may lie in a range from 10 nanometer to 10 micrometers, more particular from 100 nanometer to 10 micrometers, more particular from 1 micrometer to 10 micrometers. The thickness of the carbon-comprising layer may depend on the process used for forming the layer. In particular, the thickness of the carbon-comprising layer may be adjusted by varying the laser dose in a laser process or the micro electrical discharge power in a micro electrical discharge machining process.

According to an embodiment the silicon carbide layer is part of a silicon carbide wafer.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1:
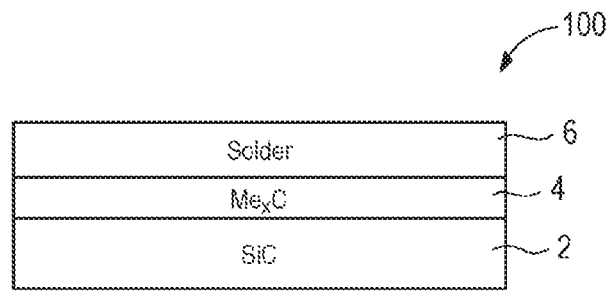
FIG. 1 schematically illustrates a cross-sectional side view of a semiconductor device in accordance with the disclosure.

FIG. 1 schematically illustrates a cross-sectional side view of a semiconductor device 100 in accordance with the disclosure. The semiconductor device 100 is illustrated in a general manner in order to qualitatively specify aspects of the disclosure. The semiconductor device 100 may include further components which are not illustrated for the sake of simplicity. For example, the semiconductor device 100 may be extended by any of the aspects described in connection with other devices in accordance with the disclosure.

The semiconductor device 100 includes a silicon carbide layer 2 and a metal carbide layer 4 arranged over the silicon carbide layer 2. In one example, the metal carbide layer 4 may be in contact with the silicon carbide layer 2. In a further example, a carbon-comprising layer (not illustrated) may be arranged between the silicon carbide layer 2 and the metal carbide layer 4. The semiconductor device 100 further includes a solder layer 6 arranged over and in contact with the metal carbide layer 4.

Figure 2A:
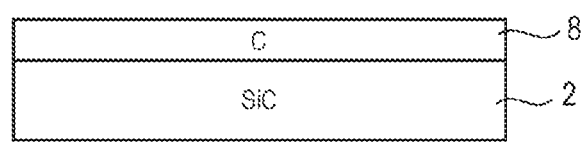
FIGS. 2A to 2C schematically illustrate respective cross-sectional side views of a method for manufacturing a semiconductor device in accordance with the disclosure.
Figure 2B:
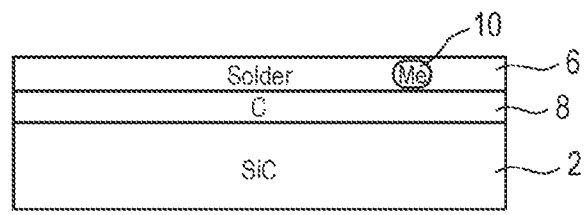
Figure 2C:
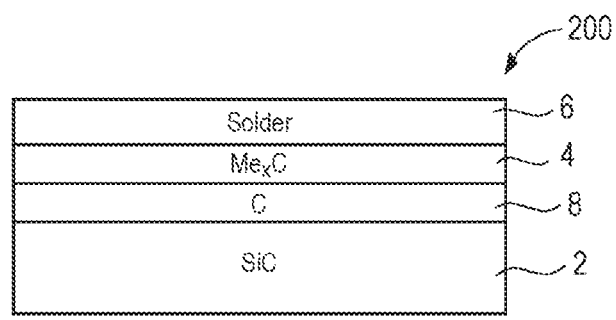

FIGS. 2A to 2C schematically illustrate respective cross-sectional side views of a method for manufacturing a semiconductor device 200 in accordance with the disclosure. The manufactured semiconductor device 200 may be similar to the semiconductor device 100 of FIG. 1. The method of FIGS. 2A to 2C is illustrated in a general manner in order to qualitatively specify aspects of the disclosure. The method may include further aspects which are not illustrated for the sake of simplicity. For example, the method may be extended by any of the aspects described in connection with other methods in accordance with the disclosure.

In FIG. 2A, a carbon-comprising layer 8 is formed on a silicon carbide layer 2. For example, the carbon-comprising layer 8 may be a graphite layer formed by a laser annealing process or by a micro electrical discharge machining process.

In FIG. 2B, a solder layer 6 is formed on the carbon-comprising layer 8. The solder layer 6 includes a carbide-forming metal 10.

In FIG. 2C, a metal carbide layer 4 is formed between the carbon-comprising layer 8 and the solder layer 6. The metal carbide layer 4 is formed from the carbide-forming metal 10 of the solder layer 6 and carbon of the carbon-comprising layer 8. In one example, the carbon-comprising layer 8 may be partly used for forming the metal carbide layer 4 such that a part of the carbon-comprising layer 8 may remain between the silicon carbide layer 2 and the metal carbide layer 4 (see e.g. FIG. 2C). In a further example, the carbon-comprising layer 8 may be entirely used for forming the metal carbide layer 4 such that the metal carbide layer 4 may be in contact with the silicon carbide layer 2 (see e.g. FIG. 1).

FIGS. 3A to 3J schematically illustrate respective cross-sectional side views of a method for manufacturing silicon carbide devices 300 in accordance with the disclosure. The manufactured silicon carbide devices 300 may be seen as a more detailed implementation of the semiconductor device 100 of FIG. 1. In addition, the method of FIGS. 3A to 3J may be seen as a more detailed implementation of the method of FIGS. 2A to 2C.

Figure 3A:
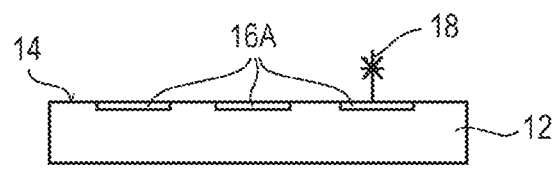
FIGS. 3A to 3J schematically illustrate respective cross-sectional side views of a method for manufacturing silicon carbide devices in accordance with the disclosure.

In FIG. 3A, a silicon carbide wafer 12 including a silicon carbide layer may be provided. In one example, the silicon carbide wafer 12 may be a silicon carbide diode wafer, i.e. a wafer in which multiple diode structures may be formed. A laser process may be applied to the frontside 14 of the silicon carbide wafer 12 to form carbon-comprising layers, in particular graphite layers 16A. In the example of FIG. 3A, the graphite layers 16A may be formed by a laser annealing process by applying laser light of a laser 18. In a further example, the graphite layers 16A may be formed by a micro electrical discharge machining process. For example, each of the graphite layers 16A may be arranged over one of the diode structures in the silicon carbide wafer 12. The graphite layers 16A may form frontside contacts of diode chips that are to be produced from the silicon carbide wafer 12.

Figure 3B:
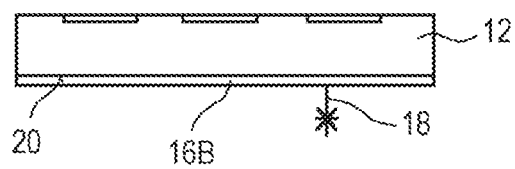

In FIG. 3B, a similar laser process or a micro electrical discharge machining process may be applied to the backside 20 of the silicon carbide wafer 12 to form a carbon-comprising layer, in particular a graphite layer 16B. In one example, the graphite layer 16B may cover the entire backside 20 of the silicon carbide wafer 12. The graphite layer 16B may later on form backside contacts of diode chips that are to be produced from the silicon carbide wafer 12.

Figure 3C:
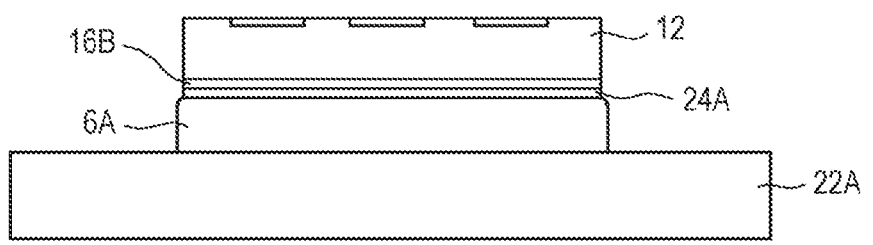

In FIG. 3C, the silicon carbide wafer 12 may be attached to a metal component 22A. In the example of FIG. 3C, the metal component may be a carrier foil 22A which may e.g. be made of copper. In particular, the graphite layer 16B may be soldered to the carrier foil 22A via a solder layer 6A. In the example of FIG. 3C, the solder layer 6A may include an active tin-silver solder alloy. In addition, the solder layer 6A may include a carbide-forming metal and a rare earth metal. In particular, the carbide-forming metal may be titanium and the rare earth metal may be cerium. By forming the solder contact a titanium carbide layer 24A may at least partly be formed between the graphite layer 16B and the solder layer 6A. The titanium carbide layer 24A may be formed from the titanium of the solder layer 6A and carbon of the graphite layer 16B. It is to be noted that a part of the titanium carbide layer 24A may be formed before the solder process when the solder layer 6A is applied to the graphite layer 16B. The cerium of the solder layer 6A may be configured to react with (ambient) oxygen during the solder process and/or during the application of the solder layer 6A to the graphite layer 16B such that an oxidation of the titanium carbide layer 24A may be avoided.

Figure 3D:
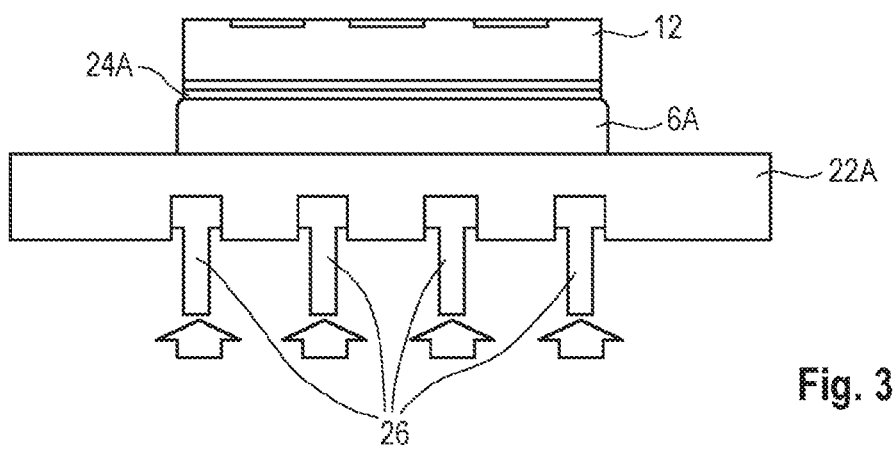

In FIG. 3D, a micro electrical discharge machining process (or micro spark erosion process) may be applied to the carrier foil 22A, the solder layer 6A and the titanium carbide layer 24A. In this connection, a sink electrode 26 with a comb-like structure and including multiple sub-electrodes may be used. During the process the sink electrode 26 may be moved towards the silicon carbide wafer 12 (see arrows), wherein material of the carrier foil 22A, the solder layer 6A and the titanium carbide layer 24A may be eroded at the positions of the sub-electrodes. The sub-electrodes of the sink electrode 26 may particularly be arranged at the positions where multiple silicon carbide devices will be separated from the silicon carbide wafer 12 later on. The micro electrical discharge machining process may be performed in a polar (dielectric) fluid. As an alternative to the micro electrical discharge machining process the carrier foil 22A, the solder layer 6A and the titanium carbide layer 24A may be processed by applying a wet chemical etching process or a laser dicing process.

Figure 3E:
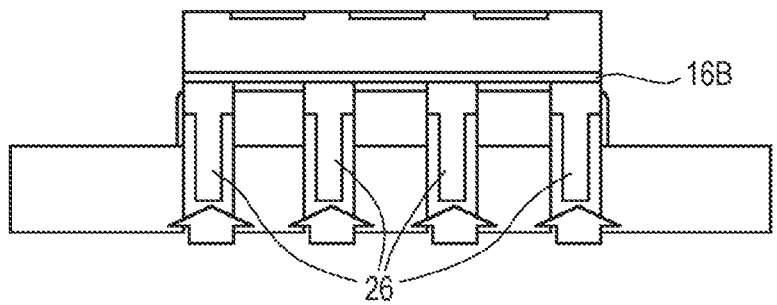

In FIG. 3E, the micro electrical discharge machining process may be stopped at the graphite layer 16B. For example, the micro electrical discharge power may be chosen such that the material of the graphite layer 16B is not eroded by the sink electrode 26.

Figure 3F:
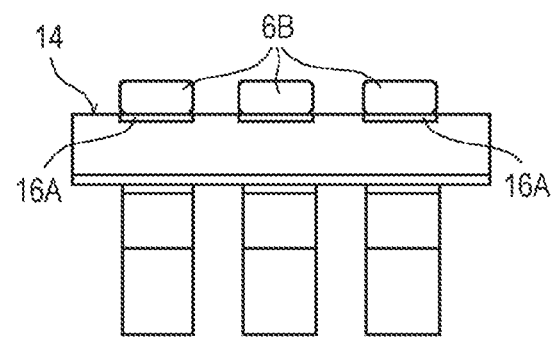

In FIG. 3F, further solder layers 6B may be applied to the graphite layers 16A on the frontside 14 of the silicon carbide wafer 12. The solder layers 6B may include an active tin-silver solder alloy. In addition, the solder layers 6B may include carbide-forming titanium and the rare earth metal cerium.

Figure 3G:
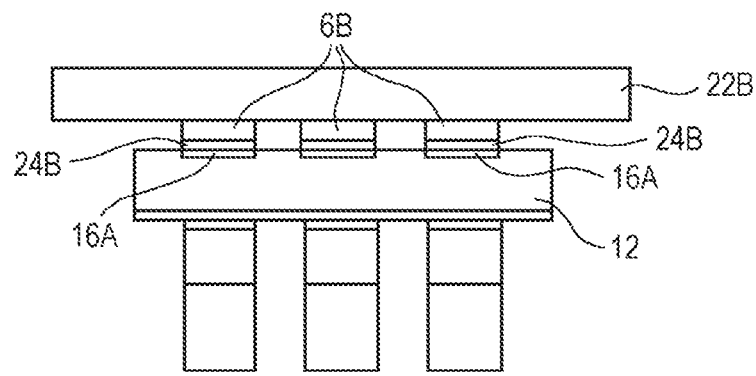

In FIG. 3G, a metal component 22B may be attached to the silicon carbide wafer 12. In particular, the metal component 22B may be soldered to the graphite layers 16A via the solder layers 6B. In the example of FIG. 3G, the metal component may be a metal foil 22B which may e.g. be made of copper. Similar to FIG. 3C, further titanium carbide layers 24B may be formed between the solder layers 6B and the graphite layers 16A. The titanium carbide layers 24B may be formed from the titanium of the solder layers 6B and carbon of the graphite layers 16A. Note that the titanium carbide layers 24B may have been at least partly formed when the solder layers 6B were applied to the graphite layers 16A in FIG. 3F.

Figure 3H:
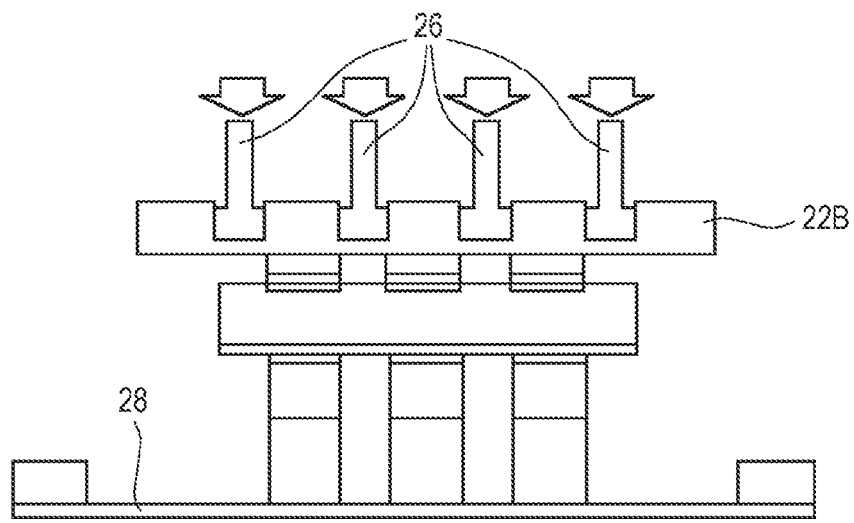

In FIG. 3H, the arrangement of FIG. 3G may be optionally mounted on a tape & frame 28. In addition, a micro electrical discharge machining process (or micro spark erosion process) may be applied to the metal foil 22B. Similar to FIG. 3E a sink electrode 26 having a comb-like structure and multiple sub-electrodes may be used. The material of the metal foil 22B may be eroded at the positions of the sub-electrodes. The sub-electrodes may move completely through the metal foil 22B (see arrows). The micro electrical discharge machining process may be performed in a polar (dielectric) fluid. As an alternative to the micro electrical discharge machining process the metal foil 22B may be processed by applying a wet chemical etching process or a laser dicing process.

Figure 3I:
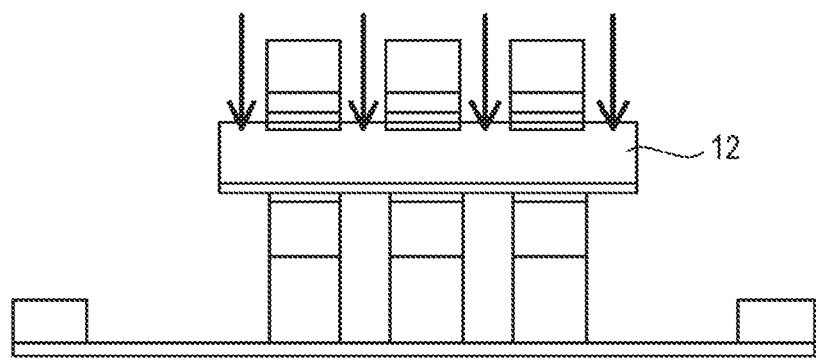

In FIG. 3I, the silicon carbide wafer 12 may be separated into multiple silicon carbide devices. In particular, a dicing through the silicon carbide wafer 12 may be performed (see arrows). In this connection, a plasma dicing process, an ultrasonic mechanical dicing process, a laser dicing process or a combined process of e.g. a laser annealing process and a plasma dicing process may be used. A plasma dicing process may include a plasma etching process using $FCl_3$, Ar, $O_2$ and/or $CF_6$ plasma with high plasma power and chamber pressure.

Figure 3J:
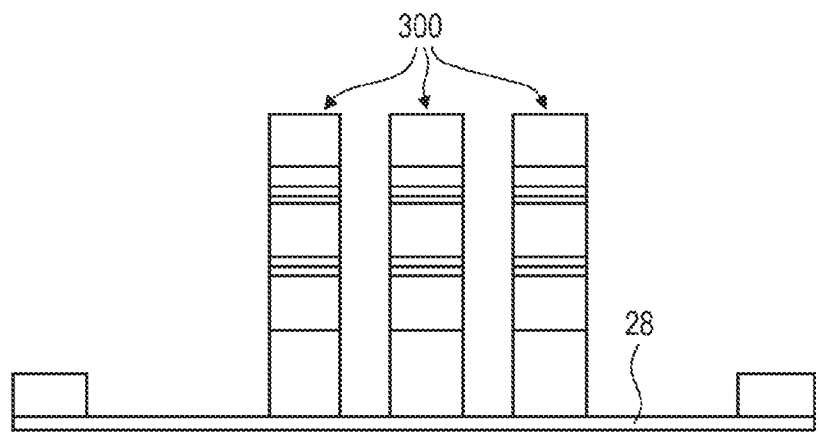

In FIG. 3J, the separation process of FIG. 3I may be finished. Multiple separated silicon carbide devices 300 may be arranged on the tape & frame 28. In the non-limiting example of FIG. 3J, three silicon carbide devices 300 are illustrated. In further examples, the number of manufactured silicon carbide devices 300 may be arbitrary and differ from the example of FIG. 3J.

FIGS. 4A to 4F schematically illustrate respective cross-sectional side views of a method for manufacturing silicon carbide devices 400 in accordance with the disclosure. The manufactured silicon carbide devices 400 may be seen as a more detailed implementation of the semiconductor device 100 of FIG. 1. In addition, the method of FIGS. 4A to 4F may be seen as a more detailed implementation of the method of FIGS. 2A to 2C.

Figure 4A:
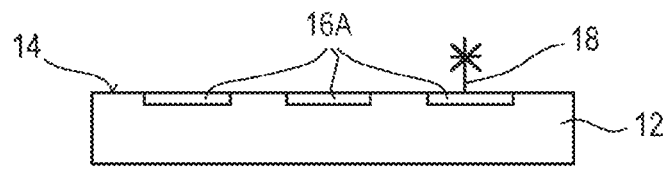
FIGS. 4A to 4F schematically illustrate respective cross-sectional side views of a method for manufacturing silicon carbide devices in accordance with the disclosure.

In FIG. 4A, a laser process may be applied to the frontside 14 of a silicon carbide wafer 12 to form graphite layers 16A. The act of FIG. 4A may be similar to the act of FIG. 3A.

Figure 4B:
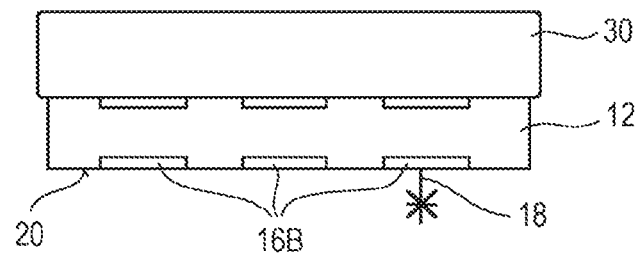

In FIG. 4B, the silicon carbide wafer 12 may be mounted on a temporary carrier 30. In an optional step, the backside 20 of the silicon carbide wafer 12 may be thinned. In addition, a laser process similar to FIG. 4A may be applied to the backside 20 of the silicon carbide wafer 12 to form graphite layers 16B. In the example of FIG. 4B, the graphite layers 16B on the backside 20 of the silicon carbide wafer 12 may be aligned to the graphite layers 16A on the frontside 14 of the silicon carbide wafer 12.

Figure 4C:
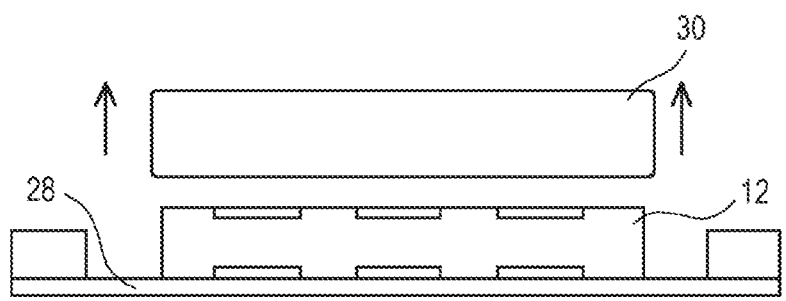

In FIG. 4C, the silicon carbide wafer 12 may be mounted on a tape & frame 28. Further, the temporary carrier 30 may be removed from the silicon carbide wafer 12 (see arrows).

Figure 4D:
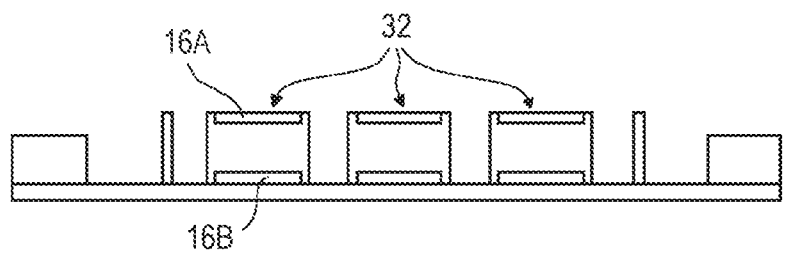

In FIG. 4D, the silicon carbide wafer 12 may be separated into multiple silicon carbide chips (or dies) 32. In one example, the silicon carbide chips 32 may be silicon carbide diode chips. The dicing process of FIG. 4D may be similar to the dicing process described in connection with FIG. 3I. Each of the separated silicon carbide chips 32 may include a contact on its frontside and a contact on its backside formed by the graphite layers 16A and 16B, respectively. The separated silicon carbide chip 32 may be shipped to the Backend.

Figure 4E:
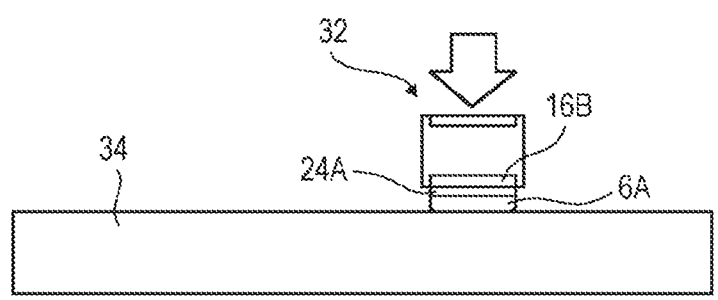

In FIG. 4E, a silicon carbide chip 32 may be attached to a leadframe 34 which may e.g. be made of copper. In particular, the graphite layer 16B may be soldered to the leadframe 34 via a solder layer 6A. The solder layer 6A may include an active tin-silver solder alloy. In addition, the solder layer 6A may include carbide-forming titanium and the rare earth metal cerium. During the solder process a titanium carbide layer 24A may be formed between the solder layer 6A and the graphite layer 16B. The titanium carbide layer 24A may be formed from the titanium of the solder layer 6A and carbon of the graphite layer 16B.

Figure 4F:
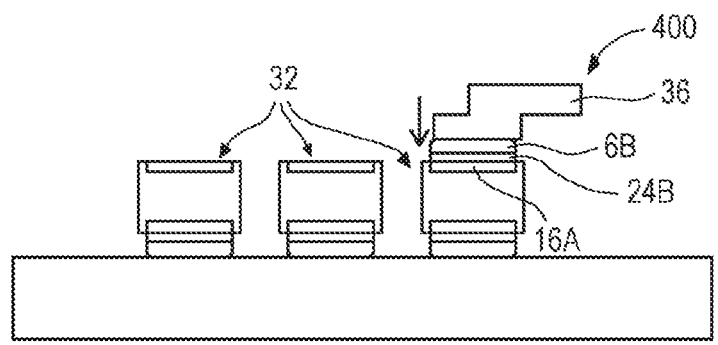

In FIG. 4F, further silicon carbide chips 32 may be attached to the leadframe 34 similar to FIG. 4E. In addition, a clip 36 may be attached to the frontside of a silicon carbide chip 32. In particular, the clip 36 may be soldered to the graphite layer 16A via a solder layer 6B. Similar to FIG. 4E, a further titanium carbide layer 24B may be formed between the solder layer 6B and the graphite layer 16A. The titanium carbide layer 24B may be formed from titanium of the solder layer 6B and carbon of the graphite layer 16A. Further clips (not illustrated) may be attached to the further silicon carbide chip 32 in a similar fashion such that multiple silicon carbide devices 400 may be provided.

FIGS. 5A to 5I schematically illustrate respective cross-sectional side views of a method for manufacturing silicon carbide devices 500 in accordance with the disclosure. The manufactured silicon carbide devices 500 may be seen as a more detailed implementation of the semiconductor device 100 of FIG. 1. In addition, the method of FIGS. 5A to 5I may be seen as a more detailed implementation of the method of FIGS. 2A to 2C.

Figure 5A:
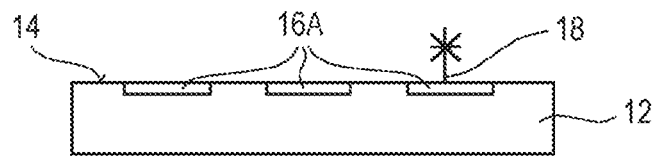
FIGS. 5A to 5I schematically illustrate respective cross-sectional side views of a method for manufacturing silicon carbide devices in accordance with the disclosure.
Figure 5B:
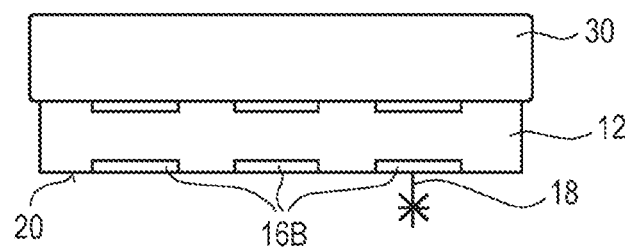
Figure 5C:
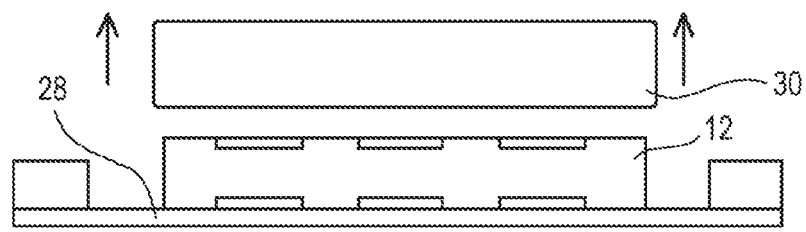

FIGS. 5A to 5C illustrate acts which may be similar to the acts of FIGS. 4A to 4C.

Figure 5D:
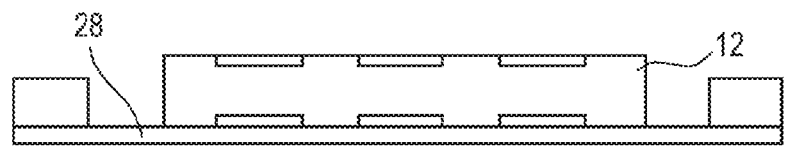

In FIG. 5D, the processed silicon carbide wafer 12 may be shipped to the Backend.

Figure 5E:
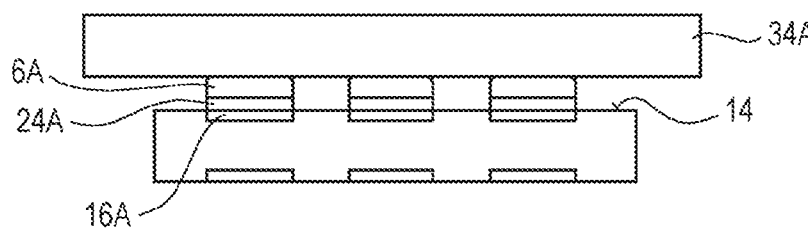

In FIG. 5E, a metal component 34A may be attached to the frontside 14 of the silicon carbide wafer 12. In the example of FIG. 5E, the metal component may be a leadframe 34A which may e.g. be made of copper. In particular, the leadframe 34A may be soldered to the graphite layers 16A via solder layers 6A. The solder layers 6A may include an active tin-silver solder alloy. In addition, the solder layers 6A may include carbide-forming titanium and the rare earth metal cerium. Titanium carbide layers 24A may be formed between the solder layers 6A and the graphite layers 16A from the titanium of the solder layers 6A and carbon of the graphite layers 16A.

Figure 5F:
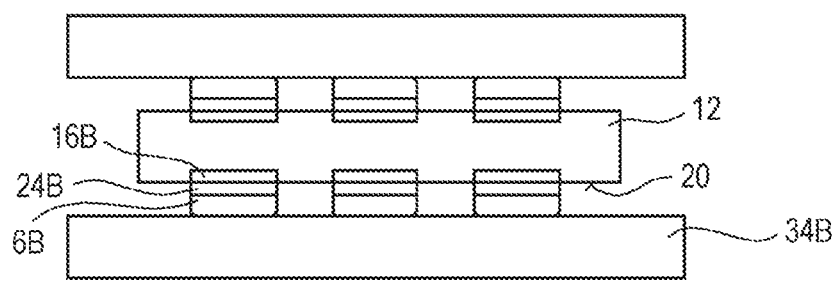

In FIG. 5F, a metal component 34B may be attached to the backside 20 of the silicon carbide wafer 12. In the example of FIG. 5F, the metal component may be a leadframe 34B which may e.g. be made of copper. A solder process used in FIG. 5F may be similar to the solder process of FIG. 5E.

Figure 5G:
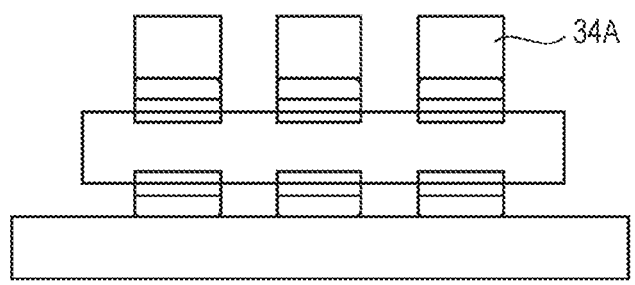

In FIG. 5G, the leadframe 34A may be structured by applying a sawing process, a wet etching process or a micro electrical discharge machining process. The act of FIG. 5G may be similar to the act of FIG. 3H.

Figure 5H:
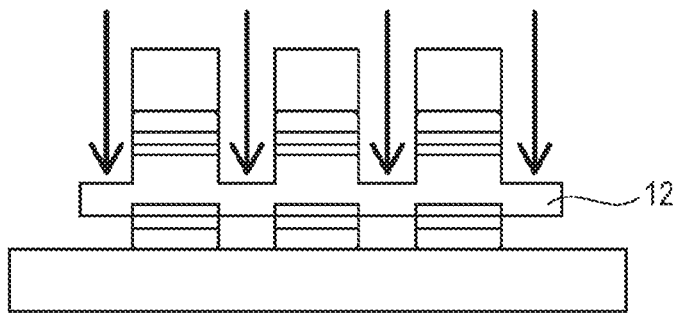

In FIG. 5H, the silicon carbide wafer 12 may be separated into multiple silicon carbide devices. The act of FIG. 5H may be similar to the act of FIG. 3I.

Figure 5I:
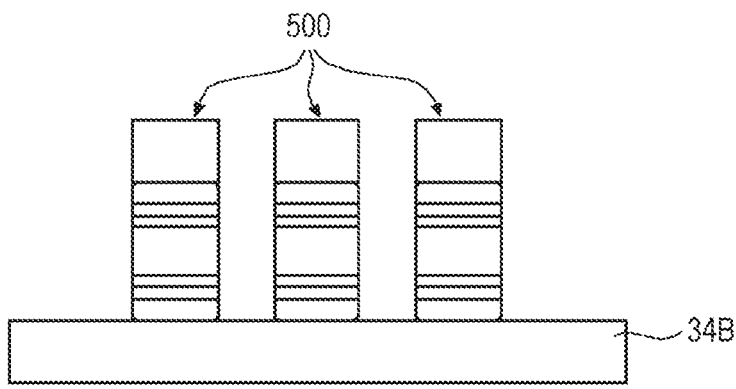

In FIG. 5I, the die separation process of FIG. 5H may be finished. Multiple separated silicon carbide devices 500 may be arranged on the leadframe 34B. In the non-limiting example of FIG. 5I, three silicon carbide devices 500 are illustrated. In further examples, the number of manufactured silicon carbide devices 500 may be arbitrary and differ from the example of FIG. 5I.

Figure 6:
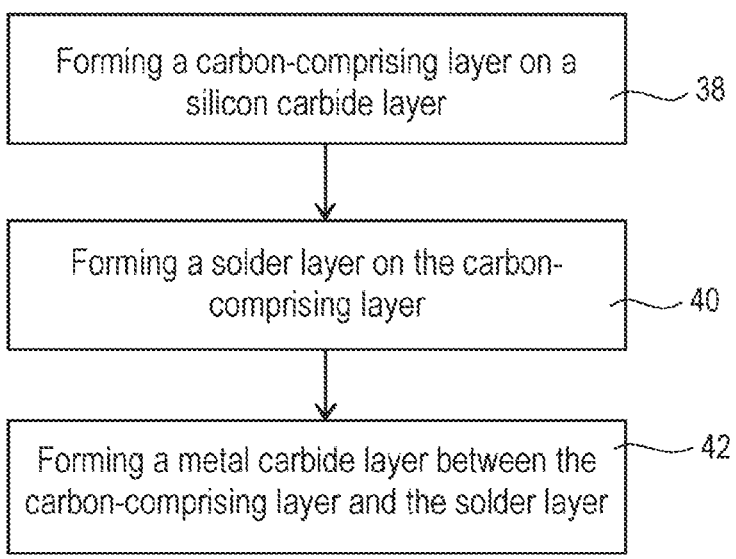
FIG. 6 illustrates a flowchart of a method for manufacturing a semiconductor device in accordance with the disclosure.

FIG. 6 illustrates a flowchart of a method for manufacturing a semiconductor device in accordance with the disclosure. The method may be similar to the method of FIGS. 2A to 2C.

At 38, a carbon-comprising layer is formed on a silicon carbide layer. At 40, a solder layer is formed on the carbon-comprising layer, wherein the solder layer includes a carbide-forming metal. At 42, a metal carbide layer is formed between the carbon-comprising layer and the solder layer, wherein the metal carbide layer is formed from the carbide-forming metal of the solder layer and carbon of the carbon-comprising layer.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer is located (e.g. formed, deposited, etc.) "above or higher than" the object and may be in contact with the surface of the object. The word "over" used with regard to e.g. a material layer formed or located "over" a surface may also be used herein to mean that the material layer is located (e.g. formed, deposited, etc.) "above or higher than" the object but may not be in contact with the surface of the object e.g. one or more additional layers may be arranged between the implied surface and the material layer.

Furthermore, to the extent that the terms "having", "containing", "including", "with" or variants thereof are used in either the detailed description or the claims, such terms are intended to be inclusive in a manner similar to the term "comprising". That is, as used herein, the terms "having", "containing", "including", "with", "comprising" and the like are open-ended terms that indicate the presence of stated elements or features, but do not preclude additional elements or features. The articles "a", "an" and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

Although the disclosure has been shown and described with respect to one or more implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
a silicon carbide layer;
a metal carbide layer arranged over the silicon carbide layer; and
a solder layer arranged over and in contact with the metal carbide layer,
wherein the solder layer comprises a carbide-forming metal corresponding to a metal of the metal carbide layer.

2. The semiconductor device of claim 1, further comprising:
a carbon-comprising layer arranged between the silicon carbide layer and the metal carbide layer, wherein the carbon-comprising layer is in contact with the silicon carbide layer and in contact with the metal carbide layer.

3. The semiconductor device of claim 2, wherein the carbon-comprising layer has a graphite crystal structure or a graphite-like crystal structure.

4. The semiconductor device of claim 2, further comprising:
an ohmic contact formed between the silicon carbide layer and the carbon-comprising layer.

5. The semiconductor device of claim 1, wherein the metal carbide layer is in contact with the silicon carbide layer.

6. The semiconductor device of claim 1, wherein the metal carbide layer comprises titanium carbide, nickel carbide, tungsten carbide, and/or vanadium carbide.

7. The semiconductor device of claim 1, wherein a thickness of the metal carbide layer is in a range from 50 nanometer to 1 micrometer.

8. The semiconductor device of claim 1, further comprising:
an ohmic contact formed between the silicon carbide layer and the metal carbide layer.

9. The semiconductor device of claim 1, further comprising:
a solder contact formed between the solder layer and a metal component that comprises a leadframe, a die pad, a lead, a clip, and/or a metal foil.

10. The semiconductor device of claim 1, wherein the semiconductor device comprises a silicon carbide diode or a silicon carbide transistor.

11. A method, comprising:
forming a carbon-comprising layer on a silicon carbide layer;
forming a solder layer over the carbon-comprising layer, the solder layer comprising a carbide-forming metal; and
forming a metal carbide layer between the carbon-comprising layer and the solder layer, the metal carbide layer being formed from the carbide-forming metal of the solder layer and carbon of the carbon-comprising layer.

12. The method of claim 11, further comprising:
forming a solder contact between the solder layer and a metal component.

13. The method of claim 12, wherein the metal carbide layer is at least partly formed by forming the solder contact.

14. The method of claim 11, wherein the metal carbide layer is at least partly formed by forming the solder layer on the carbon-comprising layer.

15. The method of claim 11, wherein forming the carbon-comprising layer comprises:
applying a laser process or a micro electrical discharge machining process to the silicon carbide layer.

16. The method of claim 11, wherein forming the carbon-comprising layer comprises:
evaporating silicon atoms from the silicon carbide layer.

17. The method of claim 11, wherein the solder layer comprises a rare earth metal before forming the metal carbide layer.

18. The method of claim 11, wherein the solder layer comprises residual portions of the carbide-forming metal after forming the metal carbide layer.

19. The method of claim 11, wherein a thickness of the carbon-comprising layer is in a range from 1 nanometer to 10 micrometers before forming the metal carbide layer.

20. The method of claim 11, wherein the silicon carbide layer is part of a silicon carbide wafer.

* * * * *